United States Patent [19]

Tanaka et al.

[11] Patent Number: 4,873,670
[45] Date of Patent: Oct. 10, 1989

[54] COMPLEMENTARY SEMICONDUCTOR MEMORY DEVICE WITH PULL-UP AND PULL DOWN

[75] Inventors: Yasunori Tanaka, Yokohama; Hideo Hashimoto, Tokyo, both of Japan

[73] Assignees: Kabushiki Kaisha Toshiba, Kawasaki; Tosbac Computer System Co., Ltd., Tokyo, both of Japan

[21] Appl. No.: 873,963

[22] Filed: Jun. 13, 1986

[30] Foreign Application Priority Data

Jun. 18, 1985 [JP] Japan ................. 60-130867

[51] Int. Cl.⁴ .......... G11C 7/00; G11C 11/40
[52] U.S. Cl. ............... 365/189.11; 365/190; 365/230.04
[58] Field of Search ......... 365/189, 190, 201, 230, 365/205, 207; 357/23.5, 23.6

[56] References Cited

U.S. PATENT DOCUMENTS

| | | | |
|---|---|---|---|
| 3,648,071 | 3/1972 | Mrazek | 307/237 |
| 4,434,381 | 2/1984 | Stewart | 307/530 |
| 4,541,077 | 9/1985 | Rupp | 365/210 |
| 4,575,823 | 3/1986 | Fitzpatrick | 365/205 X |
| 4,597,063 | 6/1986 | Takemae | 365/189 X |
| 4,646,264 | 2/1987 | Matsuzaki | 365/189 X |
| 4,658,380 | 4/1987 | Eby | 365/201 |
| 4,710,789 | 12/1987 | Furutani et al. | 365/190 X |

FOREIGN PATENT DOCUMENTS 0169980 2/1986 European Pat. Off. .
60-147998 8/1985 Japan ................. 365/190

OTHER PUBLICATIONS

Mazin et al., "A Modular Memory Building Block Approach for VLSI", IEEE 1985 Custom Integrated Circuits Conference, pp. 258-263.
Haraszti, "Novel Circuits for High Speed ROM's", IEEE Journal of Solid-State Circuits, vol. SC-19, No. 2 (Apr. 1984); pp. 180-186.

Primary Examiner—Stuart N. Hecker
Assistant Examiner—Alyssa H. Bowler
Attorney, Agent, or Firm—Finnegan, Henderson, Farabow, Garrett & Dunner

[57] ABSTRACT

A semiconductor memory device has first and second power terminals, a plurality of MOS transistors as memory cells, a plurality of word lines respectively connected to the gates of the MOS transistors, and a bit line connected to one end of the current path of each of the MOS transistors. The other end of the current path of each of the MOS transistors is selectively connected to either the first or second power terminal, in accordance with data to be stored.

4 Claims, 4 Drawing Sheets

F I G. 5
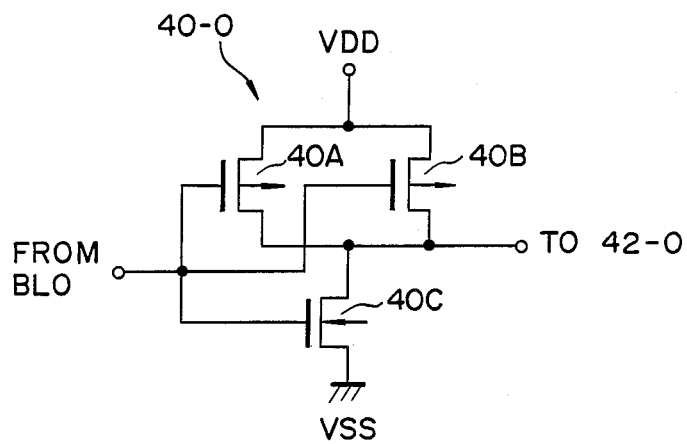
F I G. 6
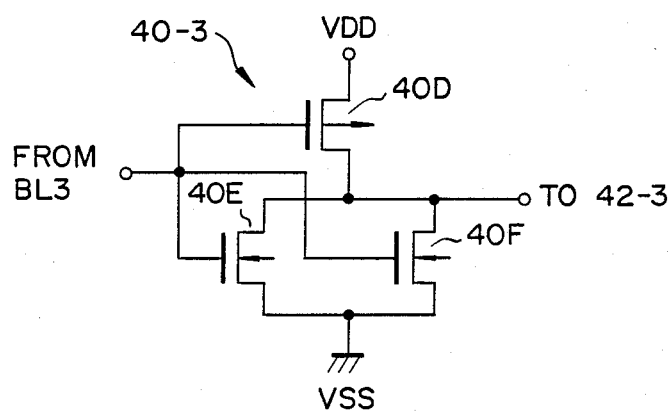

4,873,670

COMPLEMENTARY SEMICONDUCTOR MEMORY DEVICE WITH PULL-UP AND PULL DOWN

BACKGROUND OF THE INVENTION

The present invention relates to a semiconductor memory device and, more particularly, to a ROM whose memory cells are programmed by wirings corresponding to data to be stored.

Conventional custom ROMs of MOS ICs use MOS FETs of one type, e.g., n-channel MOS transistors, as memory cells. FIG. 1 shows a conventional custom ROM having a precharge circuit. The ROM in FIG. 1 has a 3-bit, 3-word memory capacity for the sake of simplicity. Word lines W0 to W2 are connected to the gates of corresponding word n-channel MOS transistors. One end of the current path of each n-channel MOS transistors is grounded and the other end thereof is selectively connected to corresponding bit line. For example, memory cell 10 is not connected to bit line B2 in order to store data "1", and memory cell 12 is connected to bit line B1 in order to store data "0".

The precharge circuit has MOS transistors 16A to 16C turned ON/OFF by clock signal φ. Bit lines B0 to B2 are respectively connected to a VDD terminal via the current paths of MOS transistors 16A to 16C.

During operation, MOS transistors 16A to 16C are rendered conductive for a predetermined period of time, every time word data is read out. Bit lines B0 to B2 are precharged to a VDD level, i.e., 5 V during this period of time. One of the word memories, e.g., a first word memory of memory cells 10, 12 and 14 is selected after the predetermined period of time. In this case, bit lines B0 and B1 are discharged through memory cells 12 and 14, while bit line B2 is kept precharged. Word data "100" is thus read out from memory cells 10, 12, and 14 onto bit lines B2 to B0.

However, the above arrangement is not suitable for manufacturing a ROM utilizing a CMOS master slice chip (or a gate array chip). A CMOS master slice chip uniformly has p- and n-channel MOS transistors. For this reason, when only n-channel MOS transistors are used as the memory cells, many p-channel MOS transistors thereof must be left unused.

The ROM in FIG. 1 requires clock signal φ for controlling turning ON/OFF of MOS transistors 16A to 16C. Signal φ must be synchronized with a timing for selecting each word memory, which complicates the structure of a clock generator (not shown).

FIG. 2 shows a conventional custom ROM having a pull-up circuit. The ROM in FIG. 2 has the same structure as that of FIG. 1, except that the precharge circuit is replaced by a pull-up circuit. The pull-up circuit consists of resistors 18A to 18C each having one end connected to a VDD terminal and the other end connected to a corresponding one of bit lines B0 to B2, respectively.

The above arrangement is also not suitable for manufacturing a ROM utilizing a CMOS master slice chip, for the same reason as for the ROM of FIG. 1. In addition, the current flowing in resistors 18A to 18C is another drawback in this type of ROM. Resistor 18C and the MOS resistors of memory cells 20 and 22 constitute a ratio circuit. Currents of different values flow constantly in resistor 18C in accordance with stored data. This is undesirable in the interest of decreasing the power consumption of the ROM.

SUMMARY OF THE INVENTION

It is an object of the present invention to provide a low power-consumption semiconductor memory device suitable for fabrication using a CMOS master slice chip as a base and requiring no complex timing control.

According to the present invention, there is provided a semiconductor memory device comprising: a first power source terminal set at a potential of a first level; a second power source terminal set at a potential of a second level lower than that of the first power source terminal; a plurality of memory blocks each of which includes a MOS transistor serving as a memory cell, the current path of each MOS transistor being, at one end, connected to one of the first and second power terminals in accordance with data to be preset; a selecting circuit which selects one of the memory blocks and turns on the MOS transistor of the selected memory block; and an output circuit having a bit line connected to the other end of the current path of each MOS transistor.

BREIF DESCRIPTION OF THE DRAWINGS

FIG. 5 shows the structure of a first inverter, shown in FIG. 3, for receiving an output voltage from memory cells formed of p-channel transistors;

FIG. 6 shows the structure of a second inverter, shown in FIG. 3, for receiving an output voltage from memory cells formed of n-channel transistors.

DETAILED DESCRIPTION OF THE PREFERRED EMBODIMENT

One embodiment of the present invention will be described with reference to FIGS. 3 to 6.

Figure 1:
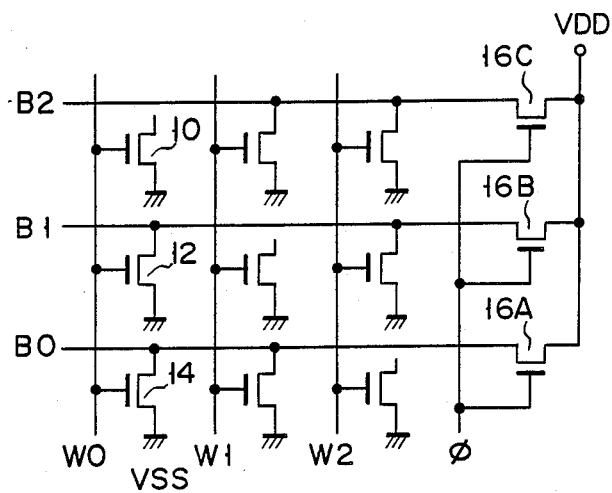
FIG. 1 shows a conventional ROM having a precharge circuit.
Figure 2:
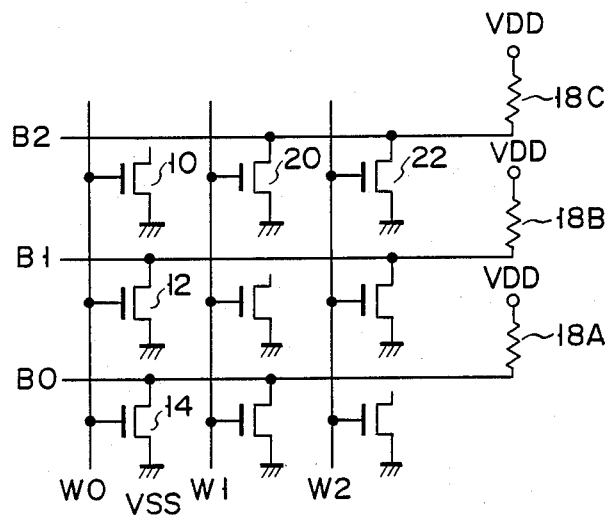
FIG. 2 shows a conventional ROM having a pull-up circuit.
Figure 3:
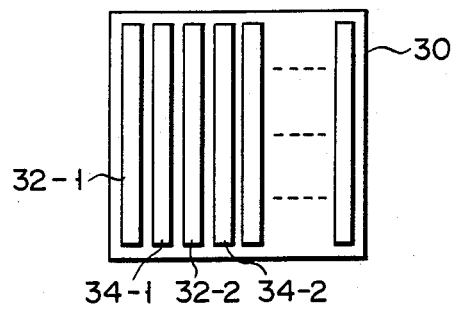
FIG. 3 is a view for explaining a semiconductor memory device according to an embodiment of the present invention, and schematically shows a planar structure of a CMOS master slice chip.

FIG. 3 schematically shows the planar structure of CMOS master slice chip 30. Chip 30 has alternating first and second logic cell arrays 32-1, 32-2, . . . ; 34-1, 34-2 . . . extending in one direction. Each of first logic cell arrays 32-1, 32-2, . . . includes p-channel MOS transistors. Each of second arrays 34-1, 34-2, . . . includes n-channel MOS transistors. The p- and n-channel transistors are arranged in a second direction perpendicular to the first direction.

Figure 4:
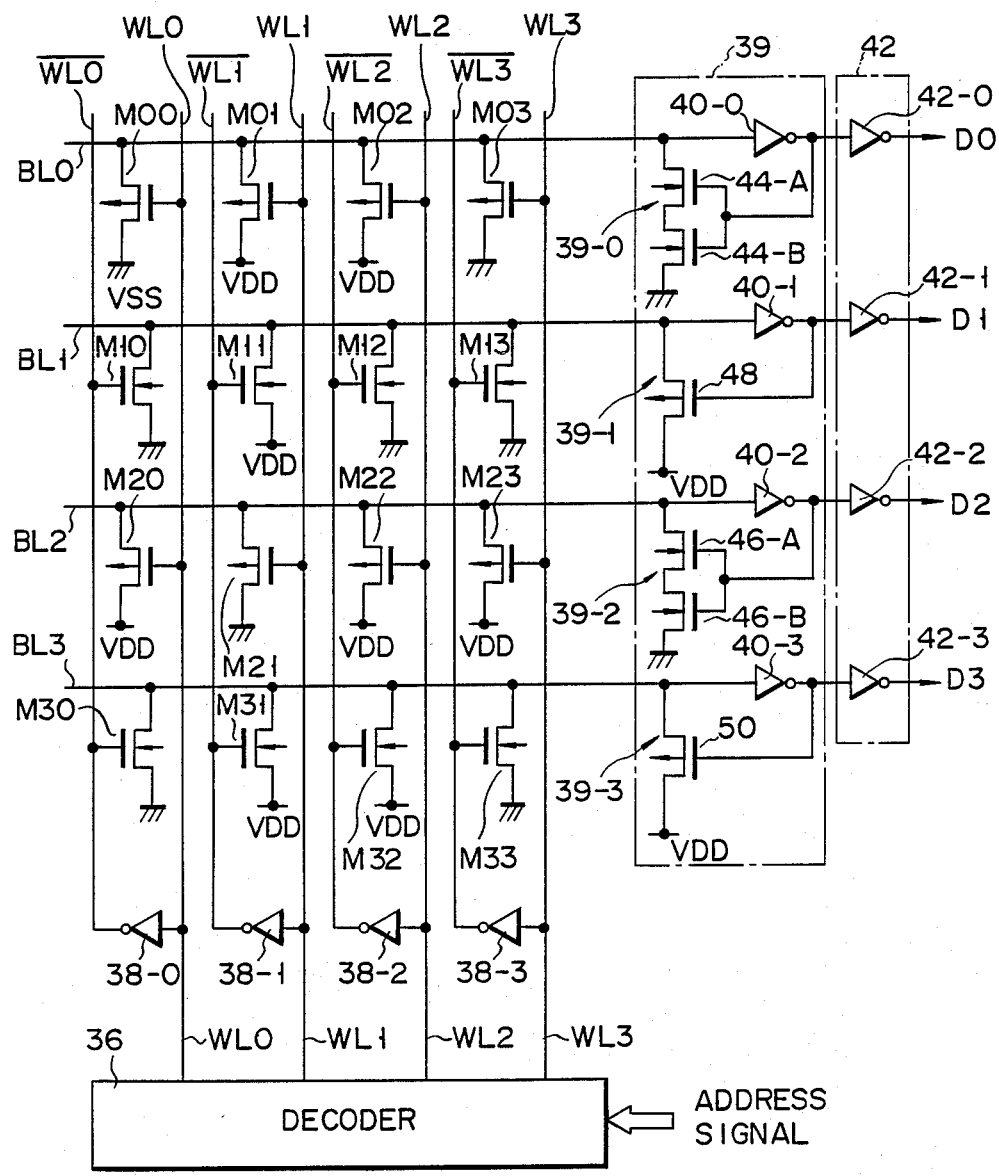
FIG. 4 is a circuit diagram of a memory circuit fabricated on the master slice chip shown in FIG. 3 as a base.

FIG. 4 is a circuit diagram of a memory circuit fabricated on chip 30. In the fabrication of the memory circuit, p- and n-channel MOS transistors on chip 30 are interconnected in accordance with a predetermined mask pattern.

The memory circuit has MOS transistors M00 to M33 as memory cells. Transistors M00 to M03 and M20 to M23 are p-channel MOS transistors respectively in arrays 32-1 and 32-2. Transistors M10 to M13 and M30 to M33 are n-channel MOS transistors respectively in arrays 34-1 and 34-2. Word lines WL0 to WL3 and $\overline{WL0}$ to $\overline{WL3}$ extend in the first direction on chip 30. Bit lines BL0 to BL3 extend in the second direction on chip 30. Groups of transistors M00 to M30, M01 to M31, M02 to M32, and M03 to M33 are respectively used as one-word memories. The gates of MOS transistors M00 and M20 are connected to line WL0 and those of transistors M10 and M30 are connected to line $\overline{WL0}$. The gates of transistors M01 and M21 are connected to line WL1 and those of transistors M11 and M31 are connectged to line $\overline{WL1}$. The gates of transistors M02 and M22 are connected to line WL2 and those of transistors M12 and M32 are connected to line $\overline{WL2}$. The gates of transistors M03 and M23 are connected to line WL3 and those of transistors M13 and M33 are connected to line $\overline{WL3}$. Decoder 36 shown in FIG. 4 decodes an address signal and supplies a select signal of ground level, e.g., 0 V, to one of lines WL0 to WL3. Inverters 38-0 to 38-3 are respectively connected between lines $\overline{WL0}$ and WL0, WL1 and $\overline{WL1}$, WL2 and $\overline{WL2}$, and WL3 and $\overline{WL3}$. The potential of lines $\overline{WL0}$ to $\overline{WL3}$ are respectively set by inverters 38-0 to 38-3 to have complementary relationship with lines WL0 to WL3. More specifically, when the first word memory is selected, the potentials of lines WL0 and $\overline{WL0}$ are set to ground and VDD levels respectively. When the first word memory is not selected, the potential of lines WL0 and $\overline{WL0}$ set to VDD and ground levels, respectively.

Line BL0 is connected to one end of the current path of each of transistors M00, M01, M02, and M03. Line BL1 is connected to one end of the current path of each of transistors M10, M11, M12, and M13. Lines BL2 is connected to one end of the current path of each of transistors M20, M21, M22, and M23. Line BL3 is connected to one end of the current path of each of transistors M30, M31, M32, and M33. The other end of the current path of each of transistors M00 to M33 is connected to one of source potential terminal VDD and ground potential terminal VSS in accordance with the logic value of the data to be stored. For example, terminals VDD and VSS are set at VDD level (=5 V) and ground level (=0 V), respectively. P-channel MOS transistors M00, M03, and M21 are connected to terminal VSS for storing data "0", and p-channel MOS transistors M01, M02, M20, M22, and M23 are connected to terminal VDD for storing data "1". N-channel MOS transistors M10, M12, M13, M30, and M33 are connected to terminal VSS for storing data "0", and n-channel MOS transistors M11, M31, and M32 are connected to terminal VDD for storing data "1". In other words, the first to fourth word memories in this embodiment store data "0100", "1011", "1101", and "0100", using each of transistors M30–M33 as an MSB (most significant bit).

Lines BL0 to BL3 are connected to input terminals of CMOS inverters 40-0 to 40-3. The output signals from inverters 40-0 to 40-3 are output as readout data through output circuit 42. Circuit 42 has CMOS inverters 42-0 to 42-3. Inverters 42-0 to 42-3 restore the logic value inverted by inverters 40-0 to 40-3, and have an adequate drive force as output buffers. The output terminal of inverter 40-0 is connected to the gates of n-channel MOS transistors 44-A and 44-B. One end of the current path of transistor 44-A is connected to line BL0, and the other end thereof is connected to terminal VSS by the current path of transistor 44-B. The output terminal of inverter 40-2 is connected to the gates of n-channel MOS transistors 46-A and 46-B. One end of the current path of transistor 46-A is connected to line BL2, and the other end thereof is connected to terminal VSS by the current path of transistor 46-B. The output terminal of inverter 40-1 is connected to the gate of p-channel MOS transistor 48. The current path of transistor 48 is connected between line BL1 and terminal VDD. The output terminal of inverter 40-3 is connected to the gate of p-channel MOS transistor 50. The current path of transistor 50 is connected between line BL3 and terminal VDD.

FIG. 5 shows the structure of inverter 40-0 in FIG. 4 in more detail, and FIG. 6 shows the structure of inverter 40-3 in FIG. 4 in more detail. Note that inverters 40-1 and 40-2 have the same structures as inverters 40-3 and 40-0, respectively. As shown in FIG. 5, inverter 40-0 has p-channel MOS transistors 40A, 40B, and n-channel MOS transistor 40C. The gates of transistors 40A, 40B, and 40C are connected to bit line BL0. The current paths of transistors 40A and 40B are connected in parallel with each other, one junction thereof is connected to terminal VDD, and the other junction thereof is connected directly to the input terminal of inverter 42-0 and to terminal VSS through the current path of transistor 40C. Inverter 40-0 constitutes a pull-down compensator together with transistors 44-A and 44-B, and is set at threshold voltage VTH of, e.g., 2.5 V. The sum of ON resistances of transistors 44-A and 44-B is higher than that of transistors M00 to M03.

Inverter 40-3 has p-channel MOS transistor 40D and n-channel MOS transistors 40E and 40F, as shown in FIG. 6. The gates of MOS transistors 40D, 40E, and 40F are connected to line BL3. One end of the current path of transistor 40D is connected to terminal VDD, and the other end thereof is connected directly to the input terminal of inverter 42-3. The current paths of transistors 40E and 40F are connected in parallel with each other, between the other end of transistor 40D and terminal VSS. Inverter 40-3 constitutes a pull-up compensator together with MOS transistor 50, and is set at threshold voltage VTH of, e.g., 2.0 V.

In operation, decoder 36 receives an address signal, and supplies a select signal onto one of word lines WL0 to WL3, e.g., line WL0. Then, the potentials of lines WL0 and $\overline{WL0}$ are respectively set at 0 V and 5 V, to selectively turn on transistors M00, M10, M20, and M30 (i.e., the first word memory). In this case, transistors M00 to M30 supply stored data to lines BL0 to BL3, respectively. In other words, lines BL0 to BL3 are connected to either terminal VDD or VSS. The data on lines BL0 to BL 3 is then respectively supplied to inverters 40-0 to 40-3, and is read out through inverters 42-0 to 42-3.

The control operation of copensator 39 shown in FIG. 4 will be described. An n-channel MOS transistor can set a bit line at 0 V as data "0" but not at 5 V as data "1." When data "1" is read out, the potential of the bit line is undesirably set to an intermediate level of about 3 V, which is lower than 5 V, by the back-gate bias effect of the n-channel MOS transistor, in accordance with the threshold voltage thereof. Meanwhile, a p-channel MOS transistor can set a bit line at 5 V as data "1" but not at 0 V as data "0". When data "0" is read out, the potential of the bit line is undesirably set to an intermediate level of about 2 V, which is higher than 0 V, by the back-gate bias effect of the p-channel MOS transistor, in accordance with the threshold voltage thereof.

For example, when transistor M31 is selected, the potential of line BL3 is changed to an intermediate level of about 3 V. Inverter 40-3 turns transistor 50 ON when the input voltage thereto exceeds 2.0 V. The potential of line BL3 is thus forcibly set at 5 V. P-channel MOS transistor 40D in inverter 40-3 is then completely turned OFF. During the period in which the potential of line BL3 is at an intermediate level between 5 and 0 V, a current flows from terminal VDD to terminal VSS through transistors 40D, 40E, and 40F. This current is blocked by turning OFF of transistor 40D. Assume that transistor M30 is selected in place of transistor M31 while transistor 50 is kept conductive. In this case, the potential of line BL3 is determined in accordance with the ratio of ON resistance of transistor M30 to ON resistance of transistor 50. The ON resistance of an n-channel MOS transistor is about half to a third that of a p-channel MOS transistor. Therefore, the potential of line BL3 is set at a value lower than threshold voltage VTH (=2.0) of inverter 40-3. At this time, MOS transistor 50 is turned OFF by inverter 40-3. The potential of line BL3 is set at 0 V when transistor 50 is completely made nonconductive. During the period in which the input voltage to inverter 40-3 is at an intermediate level between 5 and 0 V, a current flows in transistors 40D, 40E, and 40F in the same manner as described above. However, once the potential of line BL3 is set at 0 V, transistors 40E and 40F are turned OFF and block the current.

When p-channel MOS transistor M00 is selected, the potential of line BL0 is changed to an intermediate level of about 0 V. Inverter 40-0 turns ON MOS transistors 44-A and 44-B when an input voltage thereto becomes lower than 2.5 V. The potential of line BL0 is thus forcibly set at 0 V. In this case, n-channel MOS transistor 40C in inverter 40-0 is completely made nonconductive. During the period in which the potential of line BL0 is at an intermediate level between 5 and 0 V, current flows from terminal VDD to terminal VSS through p- and n-channel MOS transistors 40A, 40B, and 40C. The current is blocked by turning OFF of transistor 40C. Assume that transistor M01 is selected in place of transistor M00 while transistors 44-A and 44-B are kept conductive. In this case, the potential of line BL0 is determined in accordance with the ratio of the ON resistance of transistor M01 to the sum of ON resistances of transistors 44-A and 44-B. As described above, the ON resistance of an n-channel MOS transistor is generally half to a third that of a p-channel MOS transistor. However, since transistors 44-A and 44-B are connected in series, the potential of line BL0 is set at a value higher than threshold voltage VTH (=2.5V) of inverter 40-0. In this case, transistors 44-A and 44-B are turned OFF by inverter 40-0. The potential of line BL0 is set at 5 V when transistors 44-A and 44-B are completely made nonconductive. When the input voltage to inverter 40-0 is at an intermediate level between 5 and 0 V, current flows in transistors 40A, 40B, and 40C in the same manner as described above. However, once the potential of line BL0 is set at 5 V, transistors 40A and 40B are turned OFF and block the current.

In the above embodiment, the n- and p-channel MOS transistors formed on chip 30 are equally utilized as memory cells. As a result, the utilization efficiency of the transistors on a CMOS master slice chip is increased. In contrast to this, a conventional memory cell consists only of transistors of one conductivity type, e.g., n-channel MOS transistors. In this case, many p-channel MOS transistors cannot be used and are left inactive on the master slice chip. According to the present invention, however, bit lines BL0 to BL3 are formed to extend in the same direction as the logic cell array, and MOS transistors of the same conductivity type are connected to a single bit line. Therefore, the wiring on the CMOS master chip is free from redundancy, resulting in easy utilization of a master slice chip in the manufacture of ROMs.

Compensator 39 shown in FIG. 4 can sufficiently shorten the period of time during which the potentials of lines BL0 to BL3 are set at intermediate levels between terminals VDD and VSS. Therefore, when data on lines BL0 to BL3 are output via a CMOS buffer, the power consumption of the CMOS buffer is greatly reduced.

Figure 7:
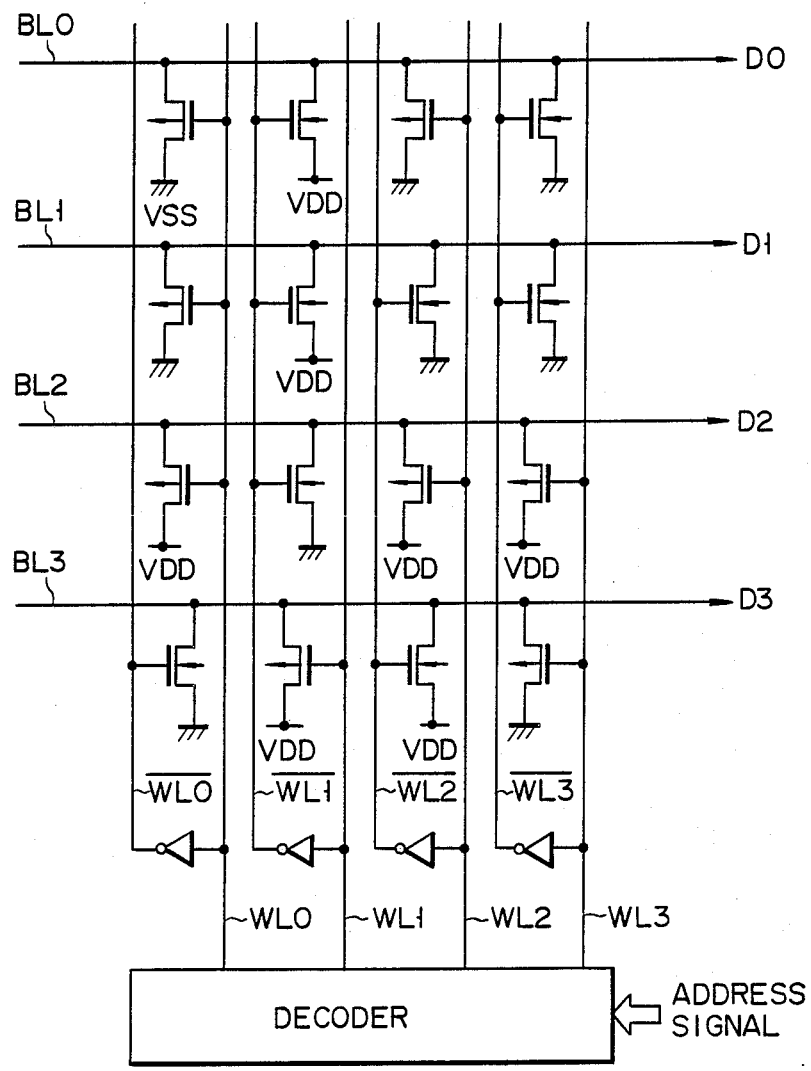
FIG. 7 shows a semiconductor memory device according to another embodiment of the invention, in which p- and n-channel MOS transistors are connected to each bit line.

In the above embodiment, data on lines BL0 to BL3 is output via compensator 39 and output buffer 42. However, when only the utilization efficiency of the MOS transistors on the CMOS master slice chip is to be increased, compensator 39 and buffer 42 can be omitted. In this case, p- and n-channel MOS transistors may be connected to the same bit line, as shown in FIG. 7. To omit a conventional precharge circuit or pull-up circuit, MOS transistors of only one conductivity type, for example n-channel MOS transistors may be used as the memory cells. Note that the current path of the MOS transistor of each memory cell is connected to one of terminals VDD and VSS in accordance with data to be preset.

What is claimed is:
1. A master slice type semiconductor memory device, comprising:
a plurality of basic cells, each constituted by p- and n-channel MOS transistors, formed as a gate array on a CMOS master slice chip;
first and second power terminals;
a plurality of word lines;
a plurality of bit lines; and
a memory section including a plurality of said p- and n-channel MOS transistors, each of said MOS transistors having a gate connected to a corresponding one of said word lines, a drain connected to a corresponding one of said bit lines, and a source selectively connected to one of said first and second power terminals to form a memory cell which is driven via the corresponding word line and supplies a potential of said one power terminal to the corresponding bit line as preset data,
in which said plurality of bit lines includes a first bit line dedicated to connection with the n-channel MOS transistors and a second bit line dedicated to connection with the p-channel MOS transistors, the memory device further comprising a pull-up compensation circuit for pulling up an output potential of said first bit line and a pull-down compensation circuit for pulling down an output potential of said second bit line.

2. A master slice type semiconductor memory device comprising:
a plurality of basic cells, each constituted by p- and n-channel MOS transistors, formed as a gate array on a CMOS master slice chip;
first and second power terminals;
a plurality of word lines;
a plurality of bit lines, including a first bit line dedicated to connection with the n-channel MOS transistors and a second bit line dedicated to connection with the p-channel MOS transistors;

a memory section including a plurality of said p- and n-channel MOS transistors, each of said MOS transistors having a gate connected to a corresponding one of said word lines, a drain connected to a corresponding one of said bit lines, and a source selectively connected to one of said first and second power terminals to form a memory cell which is driven via the corresponding word line and supplies a potential of said one power terminal to the corresponding bit line as preset data;

a pull-up compensation circuit for pulling up an output potential of said first bit line, wherein said pull-up compensation circuit includes a first inverter connected to receive the output potential of the first bit line, and at least one p-channel MOS transistor having a gate connected to an output terminal of said first inverter and a current path connected in series between said first bit line and said first power terminal; and a pull-down compensation circuit for pulling down an output potential of said second bit line, wherein said pull-down compensation circuits includes a second inverter connected to receive the output potential of the second bit line, and at least one n-channel MOS transistor having a gate connected to an output terminal of said second inverter and a current path connected in series between said second bit line and said second power terminal.

3. A master slice type semiconductor memory device according to claim 2, wherein the operation point of said pull-up compensation circuit is determined by the number of said MOS transistors connected between said first bit line and said first power terminal, and the operation point of said pull-down compensation circuit is determined by the number of said MOS transistors connected between said second bit line and said second power terminal.

4. A master slice type semiconductor memory device according to claim 2, wherein the operation point of said pull-up compensation circuit is determined by the threshold voltage of said first inverter, and the operation point of said pull-down compensation circuit is determined by the threshold voltage of said second inverter.

* * * * *